United States Patent
Yamazaki et al.

(10) Patent No.: US 9,059,369 B2
(45) Date of Patent: Jun. 16, 2015

(54) METHOD FOR MANUFACTURING TRANSPARENT CONDUCTIVE FILM

(75) Inventors: Yuka Yamazaki, Ibaraki (JP); Tomotake Nashiki, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 210 days.

(21) Appl. No.: 13/606,780

(22) Filed: Sep. 7, 2012

(65) Prior Publication Data

US 2013/0056149 A1   Mar. 7, 2013

(30) Foreign Application Priority Data

Sep. 7, 2011   (JP) ................. 2011-195214

(51) Int. Cl.
*B32B 38/08*   (2006.01)
*H01L 31/18*   (2006.01)

(52) U.S. Cl.
CPC .. *H01L 31/1884* (2013.01); *G06F 2203/04103* (2013.01); *Y02E 10/50* (2013.01)

(58) Field of Classification Search
CPC .. B32B 27/00; B32B 37/06; B32B 2307/702; B32B 2307/704; C09J 5/00; H01L 31/1884; H01L 31/022466; H01L 31/022475; H01L 224/05409; H01L 27/1274
USPC ................................. 156/280, 305
See application file for complete search history.

(56) References Cited

U.S. PATENT DOCUMENTS 6,225,010 B1 * 5/2001 Hamano et al. ............... 429/306
2010/0136276 A1   6/2010 Andou et al.

FOREIGN PATENT DOCUMENTS

| JP | 63-000454 A | 1/1988 |
|----|-------------|--------|
| JP | 2003-017431 A | 1/2003 |
| JP | 2004-136659 A | 5/2004 |
| JP | 2008-251529 A | 10/2008 |
| TW | 550598 B | 9/2003 |
| TW | I291182 B | 12/2007 |
| TW | I346614 B | 8/2011 |
| WO | 03/012799 A1 | 2/2003 |

OTHER PUBLICATIONS

JPO machine translation of JP 2003-017431, retrieved Nov. 6, 2014.*

(Continued)

*Primary Examiner* — Timothy Kennedy
(74) *Attorney, Agent, or Firm* — Westerman, Hattori, Daniels & Adrian, LLP

(57) ABSTRACT

A method for manufacturing a transparent conductive film that can reduce a heating time of crystallizing an amorphous layer containing an indium-based complex oxide is provided. The method for manufacturing a transparent conductive film according to the present invention includes a first step of laminating an amorphous layer formed of an indium-based complex oxide on a first side of a film base material having a thickness of 10 to 50 μm, a second step of forming a transparent conductive layer by heating the film base material on which the amorphous layer is laminated to 160° C. or above to crystallize the amorphous layer during a process of conveying the film base material from a feed roller and taking up the film base material on a take-up roller, and a third step of forming an adhesive layer on a second side of the film base material.

5 Claims, 2 Drawing Sheets

(56) References Cited

OTHER PUBLICATIONS

JPO machine translation of JP 2004-136659, retrieved Nov. 6, 2014.*
Korean Office Action dated Jul. 25, 2013, issued in corresponding Korean Patent Application No. 10-2012-0098431 with English translation (12 pages).
Office Action dated May 5, 2014, issued in Corresponding Taiwaniese Patent Application No. 101132837, with English Translation (9 pages).

Chinese Office Action and Search Report dated Oct. 28, 2014, issued in corresponding CN Application No. 201210330181.5 with English translation (13 pages).

Taiwanese Office Action and Search Report dated Oct. 3, 2014, issued in corresponding TW Application No. 101132837 with English translation (10 pages).

* cited by examiner

METHOD FOR MANUFACTURING TRANSPARENT CONDUCTIVE FILM

TECHNICAL FIELD

The present invention relates to a method for manufacturing a transparent conductive film.

BACKGROUND ART

Conventionally, a transparent conductive film in which a transparent conductive layer is formed on one side of a thin film base material having a thickness of approximately 25 μm has been proposed (e.g., Patent Literature 1). The transparent conductive layer in this film is formed as follows. An amorphous layer formed of an indium-based complex oxide is first laminated on one side of a film base material and is then crystallized by application of heat to form a transparent conductive layer. At this time, the application of heat may produce wrinkles in the film base material because the thickness of the film base material is small. In view of this, when manufacturing the aforementioned transparent conductive film, after the amorphous film is formed on one side of the film base material, an adhesive layer and a release film are laminated on the other side of the film base material to increase the thickness of the entire film, and then, the film base material is heated at a low temperature of the order of 140° C. Wrinkles in the transparent conductive film have been prevented in this way.

CITATION LIST

Patent Literature

Patent Literature 1: JP 2008-251529A

However, there is a problem in that performing low-temperature heating as described above results in an increase in the heating time. Patent Literature 1 discloses that approximately 90 minutes of heating is necessary. The present invention has been conceived in order to solve this problem, and it is an object of the present invention to provide a method for manufacturing a transparent conductive film with which a heating time to crystallize an amorphous layer formed of an indium-based complex oxide can be short.

SUMMARY OF INVENTION

The method for manufacturing a transparent conductive film according to the present invention includes a first step of laminating an amorphous layer formed of an indium-based complex oxide on a first side of a film base material having a thickness of 10 to 50 μm, a second step of forming a transparent conductive layer by heating the film base material on which the amorphous layer is laminated to 160° C. or above to crystallize the amorphous layer during a process of conveying the film base material from a feed roller and taking up the film base material on a take-up roller, and a third step of forming an adhesive layer on a second side of the film base material.

With this configuration, since the film base material on which an amorphous layer of an indium-based complex oxide is formed is heated at 160° C. or above, the time required to crystallize the amorphous layer can be reduced. As a result, the conveying speed of roller conveyance can be increased. At this temperature, the heating time can be considerably shorter than that of conventional examples, and can be reduced to, for example, 20 minutes or less. The heating time can be further reduced to 30 seconds to 5 minutes by heating the film base material at 180 to 200° C. Also, at this time, tension acts on the film base material because the film base material is conveyed between rolls. This makes it possible to prevent wrinkles in the film base material. Moreover, since the adhesive layer is laminated after heating of the film base material and crystallization of the amorphous layer, direct heating of the adhesive layer can be avoided. This makes it possible to prevent yellowing of the adhesive layer. When a film base material is formed of a resin, it is also possible to prevent a possibility of a defect resulting from migration of a low molecular weight substance in a polymer to the adhesive layer. According to the manufacturing method of the present invention described thus far, it is possible to obtain a high-quality transparent conductive film.

Note that although the film base material is conveyed between the feed roller and the take-up roller in the second step, the first and third steps may also be configured in the same manner. For example, the first through third steps may be performed during a process of conveying the film base material between a single pair of a feed roller and a take-up roller. Alternatively, a configuration is also possible in which, after the second step is performed between a single pair of a feed roller and a take-up roller, the third step is performed between another pair of a feed roller and a take-up roller. In other words, a different conveying system may be used in at least one or more steps. For example, it is also possible to perform the first step with a group of manufacturing facilities and perform the second and third steps with another group of manufacturing facilities.

In the above-described manufacturing method, various methods are conceivable as a method of heating the film base material. For example, the film base material may be caused to pass through a heating chamber in which the temperature is 160° C. or above. As a result, the entire film base material can be uniformly heated. In the second step, the duration of the film base material passing through the heating chamber may be 30 seconds to 5 minutes when the temperature in the heating chamber is set at 180 to 200° C. Note that the temperature in the heating chamber refers to the temperature at which the film base material is heated.

Advantageous Effects of Invention

According to the method for manufacturing a transparent conductive film of the present invention, the heating time can be shortened.

REFERENCE SIGNS LIST

Figure 1:
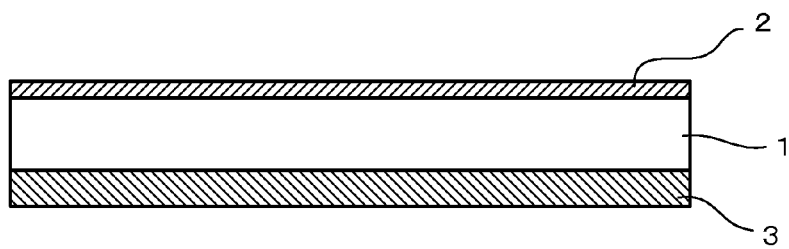
FIG. 1 is a cross-sectional view of a transparent conductive film according to an embodiment of the invention.

1 Film base material
2 Transparent conductive layer
3 Adhesive layer 10 Feed roller
20 Take-up roller
30 Heating chamber

DESCRIPTION OF EMBODIMENTS

Hereinafter, an embodiment of the method for manufacturing a transparent conductive film according to the present invention will be described with reference to the drawings. FIG. 1 is a cross-sectional view of the transparent conductive film. Below, for convenience of description, the upper side in FIG. 1 is referred to as the "top" and the lower side is referred to as the "bottom", but the position, orientation, and the like at which each member is disposed are not limited to this.

First, a transparent conductive film manufactured by the manufacturing method of the present embodiment will now be described. As shown in FIG. 1, the transparent conductive film is formed of a transparent film base material 1, a transparent conductive layer 2 formed on the upper side (first side) of the film base material 1, and an adhesive layer 3 formed on the lower side (second side) of the film base material 1. It is preferable that the film base material 1 has a thickness of 10 to 50 μm and more preferably 10 to 30 μm. This is because a film base material having a thickness greater than 50 μm is bulky for a transparent conductive film and possibly results in impaired quality. For example, when the thickness of the film base material 1 is large, there is a possibility that a large amount of volatile component is released from the film base material 1 and results in defects in an amorphous layer in the case where an amorphous indium-based complex oxide is formed as the transparent conductive layer 2 as will be described later. The material for forming the film base material 1 is not particularly limited as long as it has transparency, and examples include polyester resins such as polyethylene terephthalate and polyethylene naphthalate, polycycloolefin resins, polycarbonate resins, acetate resins, polyether sulfone resins, polyamide resins, polyimide resins, (meth)acrylic resins, and polyalylate resins.

As described above, the transparent conductive layer 2 is formed on the upper side of the film base material 1, but in order to improve adhesion with the conductive layer 2, it is also possible that a transparent undercoating layer is formed between the upper side of a film made of the aforementioned material and the transparent conductive layer 2, and this is used as the film base material 1. The undercoating layer can be formed of an inorganic substance, an organic substance, or a mixture of an inorganic substance and an organic substance. A preferable inorganic substance is, for example, $SiO_2$.

The transparent conductive layer 2 is formed of an indium-based complex oxide having high transparency and high electric conductivity. As an index of transparency, for example, a transmittance of 80% or more at a visible light wavelength of 380 to 780 nm is used. The transmittance can be measured according to, for example, JIS K-7105. As an index of electric conductivity, for example, a surface resistivity per unit area of 500Ω/□ (ohms per square) or less is used. The surface resistivity can be measured by, for example, a four-point probe method compliant with JIS K 7194 (1994). An example of such an indium-based complex oxide is indium oxide ($In_2O_3$) doped with a tetravalent metallic element. Specifically, tetravalent metal ions are substituted at lattice points of trivalent indium ions in the crystal lattice of indium oxide. Typical examples of the indium-based complex oxide include an indium-tin complex oxide and an indium-zinc complex oxide. For example, indium oxide ($In_2O_3$) containing tin oxide ($SnO_2$) may be used, and in this case, it is preferable that the indium oxide content is 90 to 99% by weight and the tin oxide content is 1 to 10% by weight. More preferably, the indium oxide content is 95 to 98% by weight and the tin oxide content is 2 to 5% by weight. Note that the tin oxide content (% by weight) can be expressed by $[(SnO_2)/(In_2O_3+SnO_2)]*100$. Also, it is preferable that the transparent conductive layer 2 has a thickness of, for example, 10 to 35 nm or more preferably 20 to 30 nm. This is because excessively large thickness of the transparent conductive layer 2 can result in impaired transparency, whereas excessively small thickness can result in an increase in surface resistivity.

The adhesive layer 3 is used to attach the transparent conductive film to an object such as a touch panel and may have a thickness of, for example, 10 to 80 μm. The material for forming the adhesive layer 3 is not particularly limited as long as it has transparency, and examples include those that use an acrylic polymer, silicone polymer, polyester, polyurethane, polyamide, epoxy polymer, or fluorine polymer as its base polymer. In particular, an acrylic adhesive is preferably used in terms of having excellent optical clarity, exhibiting appropriate adhesive properties such as wettability, cohesiveness, and adhesion, and achieving excellent weather resistance, heat resistance, and the like. Note that a film such as a release film may be attached to the lower side of the adhesive layer 3.

Figure 2:
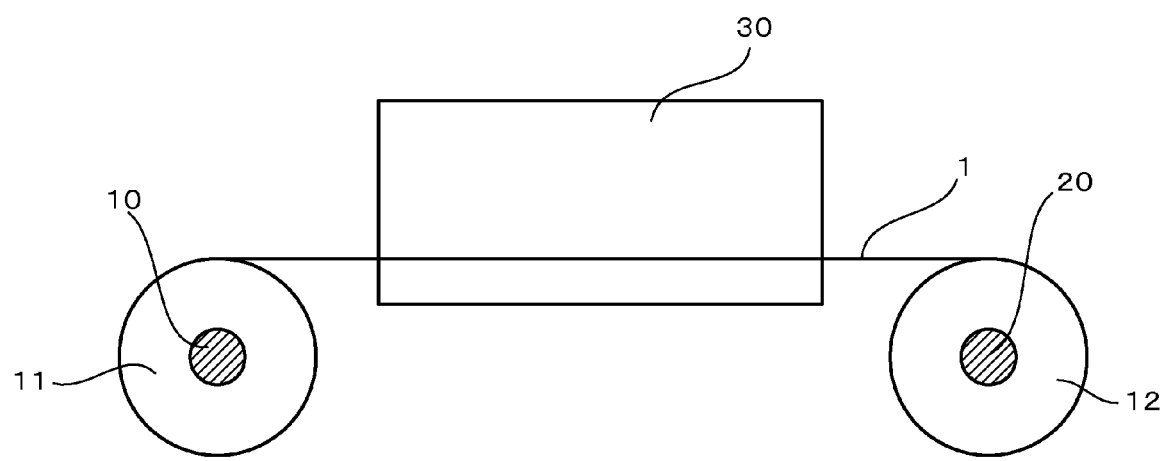
FIG. 2 is a schematic diagram illustrating part of a method for manufacturing the transparent conductive film shown in FIG. 1.

Next, a method for manufacturing a transparent conductive film configured as described above will now be described with reference to FIG. 2. FIG. 2 is a schematic diagram illustrating part of the method for manufacturing the transparent conductive film.

First, an amorphous layer formed of an indium-based complex oxide is laminated on the upper side of the film base material 1 (first step). Various methods are conceivable as a method for forming this amorphous layer, and for example, a sputtering method can be employed. The sputtering method is a method in which positive ions in plasma generated in a low-pressure gas are collided with a target that serves as a negative electrode and thereby a substance released from the surface of the target adheres to a substrate. For example, the following method may be employed when forming the above-described amorphous layer. Specifically, a known take-up sputtering system may be used in which a 500- to 5000-m roll of the film base material 1 is disposed in a vacuum chamber, and the film base material is fed from this roll and conveyed at a constant speed to deposit a film in the vacuum chamber. The film base material 1 that has undergone the film deposition is then taken up on a roll in the vacuum chamber. Other than the sputtering method, vacuum vapor deposition, ion plating, or the like may be employed.

Alternatively, from the viewpoint of manufacturing a transparent conductive film having low surface resistivity while reducing the heating time of the amorphous layer, the amorphous layer may be formed as follows. Specifically, indium-based complex oxides having different tetravalent metallic element contents are sequentially laminated on the upper side of the film base material 1 by sputtering in order to form a plurality of amorphous layers. Such a process can be implemented using a sputtering system in which a plurality of targets can be placed. For example, an indium-based complex oxide containing 6 to 15% by weight of tin oxide and an indium-based complex oxide containing 1 to 5% by weight of tin oxide may be sequentially laminated by sputtering in order to form amorphous layers of the indium-based complex oxides. A transparent conductive film that is eventually obtained through such a process is characterized by its low surface resistivity.

Then, processing for heating the above-described film base material is performed in the facilities shown in FIG. 2 (second step). The facilities include a feed roller 10 to feed the film base material 1, a heating chamber 30 to heat the fed film base material 1, and a take-up roller 20 to take up the heated film base material 1. As described above, the film base material 1 on which the amorphous layer is formed is taken up, thus forming a pre-process roll 11. Then, as shown in FIG. 2, the pre-process roll 11 is set on the feed roller 10, and the film base material 1 is fed from the pre-process roll 11 by rotating the feed roller 10. The fed film base material 1 passes through the heating chamber 30 and is then taken up by the take-up roller 20, as a result of which a processed roll 12 is formed. In this way, the film base material 1 is continuously conveyed between the rollers 10 and 20 with tension acting thereon. By heating the film base material 1 in the heating chamber 30, the amorphous layer is crystallized and the transparent conductive layer 2 is formed. It is preferable that the film base material 1 passing through the heating chamber 30 is conveyed at a rate of, for example, 10 to 30 m per minute while allowing a tension of 20 to 200 N/m to act thereon. The heating chamber 30 may be in various forms and may be, for example, an air-circulating oven or an infrared heating chamber. The temperature inside the heating chamber 30 needs to be 160° C. or above, preferably 170 to 220° C., and more preferably 180 to 200° C. When the heating temperature in the heating chamber 30 is less than 160° C., the crystallization time increases and there is a possibility that crystallization may not be completed while the film base material 1 passes through the heating chamber 30. Alternatively, there is another possibility that the conveying speed may be significantly reduced because a large amount of time needs to be spent when the film base material 1 is passed through the heating chamber 30. On the other hand, when the heating temperature is 220° C. or above, the film base material 1 may thermally deform in an excessive manner, resulting in cracks in the crystallized transparent conductive layer 2. Note that the above-described film base material 1 is preferably an elongated film base material having a length in the longitudinal direction (the aforementioned conveying direction) sufficiently greater (e.g., 10 time or more) than the length in the width direction.

Lastly, the adhesive layer 3 is formed on the lower side (the side opposite the transparent conductive layer 2) of the film base material 1 on which the transparent conductive layer 2 is formed (the third step). The method therefor is not particularly limited, and a known method can be employed. For example, the following method can be employed. First, the adhesive layer 3 is formed on a release film that has undergone mold-release processing. Then, the release film is attached to the lower side of the above-described film base material 1, and the adhesive layer 3 is transferred. At this time, the adhesive layer 3 may be formed in facilities different from those used in the second step. That is, a configuration is possible in which the adhesive layer 3 is formed during the period in which the processed roll 12 formed in the second step is fed by a feed roller and taken up by a take-up roller in other facilities. Alternatively, an adhesive layer may be formed in the facilities used in the second step. That is, after the above-described heating process is performed, the adhesive layer 3 may be formed before the resultant roll is taken up by the take-up roller 20.

As described above, according to the present embodiment, since the film base material 1 on which the amorphous layer of an indium-based complex oxide is formed is heated at 160° C. or above, the time required to crystallize the amorphous layer can be short. The above-described steps enable a considerable reduction in the heating time as compared with conventional examples, and the heating time can be reduced to, for example, 20 minutes or less. The heating time can be further reduced to 30 seconds to 5 minutes at a high heating temperature of 180 to 200° C. Here, whether or not the aforementioned amorphous layer of an indium-based complex oxide has been transformed into a crystallized layer can be checked with, for example, a cross-section transmission electron microscope. Moreover, wrinkles can be prevented because the film base material 1 when passing through the heating chamber 30 is conveyed under tension between the rollers 10 and 20. In the above-described embodiment, since the adhesive layer 3 is laminated after the amorphous layer is crystallized by heating the film base material 1, direct heating of the adhesive layer 3 can be avoided. This makes it possible to prevent yellowing of the adhesive layer 3. Moreover, a defect resulting from migration of a low molecular weight substance in the polymer that forms the film base material 1 to the adhesive layer 3 does not occur. Accordingly, a high-quality transparent conductive film can be obtained. The transparent conductive film formed in this manner can be used for a touch panel or the like, and is particularly suitable for use in a capacitive touch panel.

So far, an embodiment of the present invention has been described, but the present invention is not limited to the above-described embodiment and can be modified in various ways within the gist of the present invention. For example, multiple units of the above-described heating chamber 30 may be provided. In this case, it is sufficient that at least one heating chamber is adjusted so as to have the aforementioned temperature, and as long as at least one heating chamber has that temperature, the temperatures in other heating chambers may be less than 160° C.

While in the above-described embodiment, each step is performed using a different pair of a feed roller and a take-up roller for conveyance of the film base material between the rollers, two or more of the first to third steps may be performed using a single pair of a feed roller and a take-up roller for conveyance of the film base material between the rollers.

Moreover, while in the above-described embodiment, the amorphous layer is crystallized by passing the film base material 1 through the heating chamber 30, only the surface of the film base material 1 on which the amorphous layer is formed may be heated with a heater or the like for crystallization.

EXAMPLES

Below, examples of the present invention will be described. However, the present invention is not limited to the examples below.

Here, five examples and two comparative examples were examined. First, a film base material that was commonly used in the seven samples was provided. Specifically, an undercoating layer made of silicon oxide was formed on the upper side of a polyethylene terephthalate film having a thickness of 23 μm (manufactured by the Mitsubishi Polyester Film Corporation), and the resultant film was used as a film base material. The film base material had a length of 1000 m and a width of 1090 mm. Then, an amorphous layer having a thickness of 25 nm was laminated on the upper side of this film base material, using a take-up sputtering system. This amorphous layer was formed of amorphous indium-based complex oxide containing 3% by weight of tin oxide and 97% by weight of indium oxide. The film base material on which the amorphous layer was formed in this manner was taken up on a roll and used as a pre-process roll in the next step.

Figure 3:
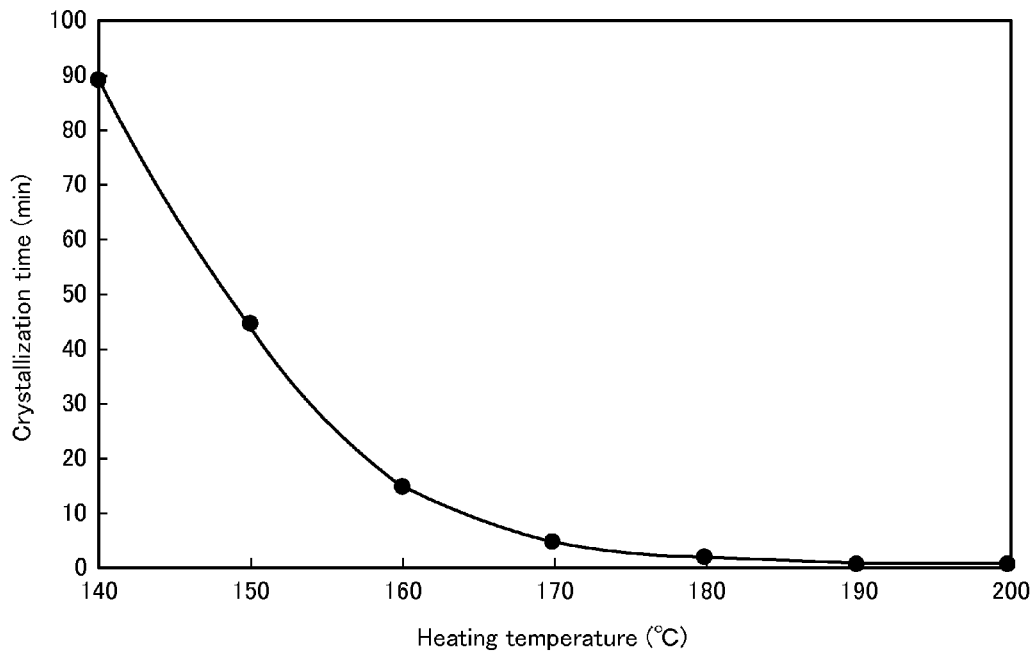
FIG. 3 is a graph showing the relationship between the heating temperature of the film base material and the crystallization time of an amorphous layer.
Figure 4:
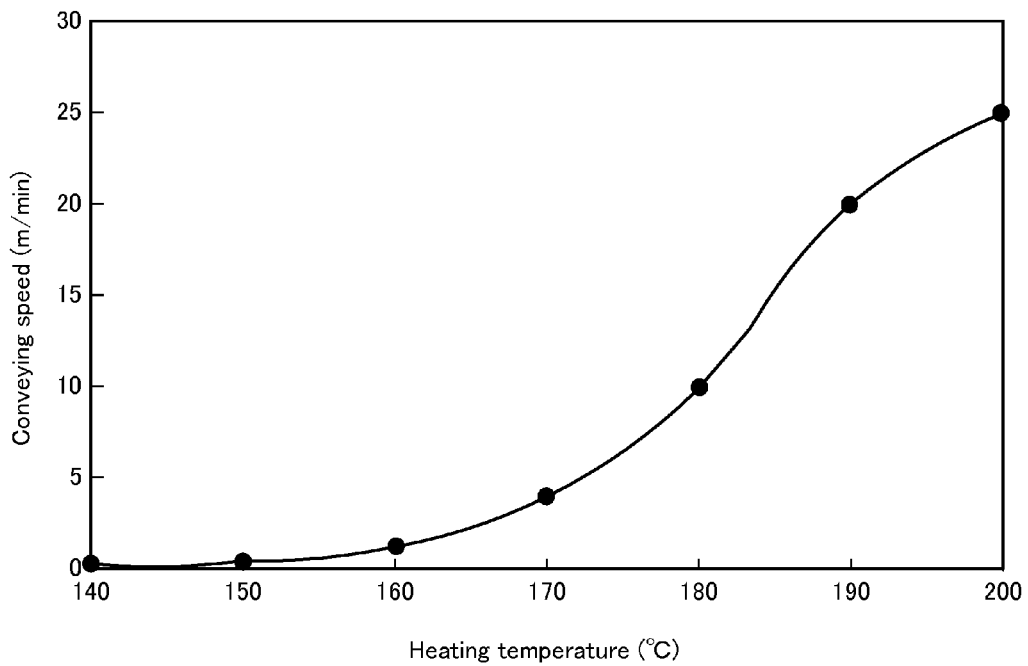
FIG. 4 is a graph showing the relationship between the heating temperature and the conveying time of the film base material.

Next, the above-described pre-process roll was set on a feed roller in manufacturing facilities as shown in FIG. 2, and the film base material was fed from this roll and continuously conveyed into a heating chamber having a length of approximately 20 m. Here, the heating time and the conveying speed for the seven samples were configured as follows. The relationship between the heating time and the conveying speed was determined based on crystallization of the amorphous layer. FIG. 3 is a graph showing the relationship between the heating temperature of the film base material and the time required to crystallize the amorphous layer, and FIG. 4 is a graph showing the relationship between the heating temperature and the conveying speed of the film base material.

TABLE 1

|  | Heating Temperature (° C.) | Crystallization Time (min) | Conveying Speed (m/min) | Total heating time (hr) |
|---|---|---|---|---|
| Example 1 | 200 | 0.8 | 25.0 | 0.7 |
| Example 2 | 190 | 1 | 20.0 | 0.8 |
| Example 3 | 180 | 2 | 10.0 | 1.7 |
| Example 4 | 170 | 5 | 4.0 | 4.2 |
| Example 5 | 160 | 15 | 1.3 | 12.5 |
| Comparative Example 1 | 150 | 45 | 0.4 | 37.5 |
| Comparative Example 2 | 140 | 90 | 0.2 | 75.0 |

The film base material that had passed through the heating chamber was taken up by the take-up roller, thereby forming a processed roll. At this time, tension acting on each film base material was 28 N/m. In all samples, the amorphous layer was crystallized and the transparent conductive layer having a thickness of 25 nm was formed, as will be described later.

Then, each film base material was fed from each processed roll, and the adhesive layer was formed on the lower side of the film base material. Specifically, first, an adhesive film was provided in which an acrylic adhesive layer was formed on a film that has undergone mold-release processing, and was taken up on a roll. Then, in parallel with the feeding of the film base material from the processed roll, the adhesive film was fed from the roll on which the adhesive film had been taken up. Then, the speeds of conveying the adhesive film and the film base material were synchronized such that the adhesive layer of the adhesive film was bonded to the lower side of the film base material that is being conveyed. The film base material on which the adhesive layer was formed was taken up on a roll.

The surface resistivity of each transparent conductive film obtained through the above-described steps was measured. A four-point probe method compliant with JIS K 7194 (1994) was employed as the measurement method. The results showed that all the samples had a surface resistivity of 300Ω/☐ and exhibited high electric conductivity. That is, it was confirmed that the indium-based complex oxide was crystallized in each sample.

Then, the examples and comparative examples were examined. As can be understood from the graph in FIG. 3, when the heating temperature is less than 160° C. as in the comparative examples 1 and 2, the crystallization time steeply increases. Also, as can be understood from the graph in FIG. 4, at a heating temperature of less than 160° C., the conveying speed is below 1 m/min, which is impractical for a rolling process. In particular, in the comparative examples 1 and 2, since the conveying speed is 0.4 m/min or less, 24 hours or more are necessary to crystallize, for example, the amorphous layer of the 1000-m film base material. This is impractical. On the other hand, it can be understood that, as demonstrated in the examples, when the heating temperature is 160° C. or above, the heating time can be considerably reduced to 15 minutes or less. In addition, since the adhesive layer is laminated after the process of heating the amorphous layer, the adhesive layer is not directly heated. Therefore, in the transparent conductive films formed by the above-described method, the adhesive layer was not yellowed. Furthermore, since there was no migration of the low molecular weight substance in the polymer forming the film base material to the adhesive layer, there was no defect in the adhesive layer.

The invention claimed is:

1. A method for manufacturing a transparent conductive film comprising:
a first step of laminating an amorphous layer formed of an indium-based complex oxide on a first side of a film base material having a thickness of 10 to 50 μm;
a second step of forming a transparent conductive layer by heating the film base material on which the amorphous layer is laminated to 160° C. or above to crystallize the amorphous layer during a process of conveying the film base material from a feed roller and taking up the film base material on a take-up roller; and
a third step of forming an adhesive layer on a second side of the film base material after the second step.

2. The method for manufacturing a transparent conductive film according to claim 1, wherein in the second step, the film base material is heated at a temperature of 180 to 220° C.

3. The method for manufacturing a transparent conductive film according to claim 1, wherein in the second step, heating is performed by passing the film base material through a heating chamber.

4. The method for manufacturing a transparent conductive film according to claim 3, wherein in the second step, a temperature in the heating chamber is 180 to 220° C., and a time the film base material passes through the heating chamber is 30 seconds to 5 minutes.

5. The method for manufacturing a transparent conductive film according to claim 2, wherein in the second step, heating is performed by passing the film base material through a heating chamber.

* * * * *